United States Patent
Ng

(10) Patent No.: US 9,035,805 B2
(45) Date of Patent: May 19, 2015

(54) SYSTEM AND METHOD FOR PROVIDING A SINGLE AND DUAL KEY PRESS KEYPAD

(75) Inventor: Chee Yu Ng, Singapore (MY)

(73) Assignee: STMicroelectronics Asia Pacific Pte Ltd, Singapore (SG)

( * ) Notice: Subject to any disclaimer, the term of this patent is extended or adjusted under 35 U.S.C. 154(b) by 1091 days.

(21) Appl. No.: 12/462,862

(22) Filed: Aug. 11, 2009

(65) Prior Publication Data

US 2010/0164757 A1  Jul. 1, 2010

Related U.S. Application Data

(60) Provisional application No. 61/203,976, filed on Dec. 31, 2008.

(51) Int. Cl.
| | |
|---|---|
| *H03M 11/00* | (2006.01) |
| *H03K 17/94* | (2006.01) |
| *H03M 11/08* | (2006.01) |
| *G06F 3/023* | (2006.01) |

(52) U.S. Cl.
CPC .............. *H03M 11/08* (2013.01); *G06F 3/023* (2013.01)

(58) Field of Classification Search
None
See application file for complete search history.

(56) References Cited

U.S. PATENT DOCUMENTS

| 5,339,358 A * | 8/1994 | Danish et al. ................. 379/368 |
| 6,231,252 B1 * | 5/2001 | Kitamura ....................... 400/484 |
| 7,015,896 B2 * | 3/2006 | Levy et al. ..................... 345/168 |
| 2002/0136372 A1 * | 9/2002 | Bozorgui-Nesbat ....... 379/93.18 |
| 2007/0262885 A1 * | 11/2007 | Kling .............................. 341/22 |
| 2007/0279256 A1 * | 12/2007 | Salman et al. .................. 341/23 |

* cited by examiner

*Primary Examiner* — Firmin Backer
*Assistant Examiner* — Jerold Murphy
(74) *Attorney, Agent, or Firm* — Gardere Wynne Sewell LLP

(57) ABSTRACT

A system and method for receiving character entries in mobile computer devices uses an improved keypad. The keypad uses a dual key press method in which each key of the keypad includes a unique key definition when it alone is pressed. Each of two adjacent keys of the keypad also include a unique key definition when the two adjacent keys are pressed at substantially the same time. A keypad controller receives inputs from the keys and decodes the single key entries and the dual key entries. The keypad occupies a relatively small keypad area while providing full size keys for the user. The keypad also has a mode key that enables a user to change the alphabet mode of the keypad to a numerical mode.

18 Claims, 2 Drawing Sheets

| Q 210 | W 211 | E | R | T 212 | Y | U 213 | I 214 | O | P 215 |
|---|---|---|---|---|---|---|---|---|---|
| A 216 | S | D 217 | F | G 218 | H | J 219 | K | L 220 | — 221 |
| MODE 222 | Z 223 | X | C 224 | V | B 225 | N 226 | — | M 227 | |

SYSTEM AND METHOD FOR PROVIDING A SINGLE AND DUAL KEY PRESS KEYPAD

CROSS-REFERENCE TO RELATED APPLICATION(S) AND CLAIM OF PRIORITY

The present application is related to U.S. Provisional Patent No. 61/203,976, filed Dec. 31, 2008, entitled "SYSTEM AND METHOD FOR PROVIDING AN IMPROVED KEYPAD". Provisional Patent No. 61/203,976 is assigned to the assignee of the present application and is hereby incorporated by reference into the present application as if fully set forth herein. The present application hereby claims priority under 35 U.S.C. §119(e) to U.S. Provisional Patent No. 61/203,976.

TECHNICAL FIELD

This disclosure is generally directed to a keypad for computer devices. More particularly, this disclosure is directed to a keypad for small mobile computer devices.

BACKGROUND

For many mobile computer devices, the keypad is the primary user interface. As mobile computer devices become smaller, the area that is available on the devices for the keypad becomes critically limited. As the available keypad space on a device becomes more and more limited, the size of the keys on the keypad becomes smaller and smaller. The small key size makes it more difficult for a user to accurately press the keys. This is because the size of the end of the user's finger is large with respect to the small size of the keys. When the user is attempting to press one particular key, the user's finger may inadvertently press an adjacent key as well. This may result in an incorrect signal being sent from the keypad to the computer device.

SUMMARY

A system for entering characters into a computer device is provided. The system includes a keypad and a controller. The keypad includes a plurality of keys. The keypad is configured to send a first signal when a first key is depressed and a second signal when a second key is depressed. The controller is configured to receive the first and second signals. The controller further is configured to identify a first character when the first signal is received and a second character when the first and second signals are received at substantially the same time.

A method for entering characters into a computer device is provided. The method includes receiving a key stroke signal from a keypad. The keypad includes a plurality of keys. Each key is associated with at least one character. The key stroke signal is associated with a first character when a first key is depressed and a second character when the first key and a second key are depressed at substantially the same time. The method also includes determining a selected character associated with the key stroke signal.

A portable computer device is provided. The device includes a keypad and a controller. The keypad includes a plurality of keys. Each key is associated to at least one of a number of characters. The keypad is configured to send a key stroke signal corresponding to a selected character. The controller is configured to receive the key stroke signal and use the key stroke signal to identify a first character when a first key is depressed and a second character when the first key and a second key are depressed at substantially the same time.

It may be advantageous to set forth definitions of certain words and phrases used throughout this patent document. The term "couple" and its derivatives refer to any direct or indirect communication between two or more elements, whether or not those elements are in physical contact with one another. The terms "include" and "comprise," as well as derivatives thereof, mean inclusion without limitation. The term "or" is inclusive, meaning and/or. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like. The term "controller" means any device, system, or part thereof that controls at least one operation. A controller may be implemented in hardware, firmware, software, or some combination of at least two of the same. The functionality associated with any particular controller may be centralized or distributed, whether locally or remotely.

BRIEF DESCRIPTION OF THE DRAWINGS

For a more complete understanding of this disclosure, reference is now made to the following description, taken in conjunction with the accompanying drawing, in which:

FIG. 2 illustrates an exemplary structure of a keypad having a QWERTY layout according to another advantageous embodiment of the invention.

DETAILED DESCRIPTION

Figure 1:
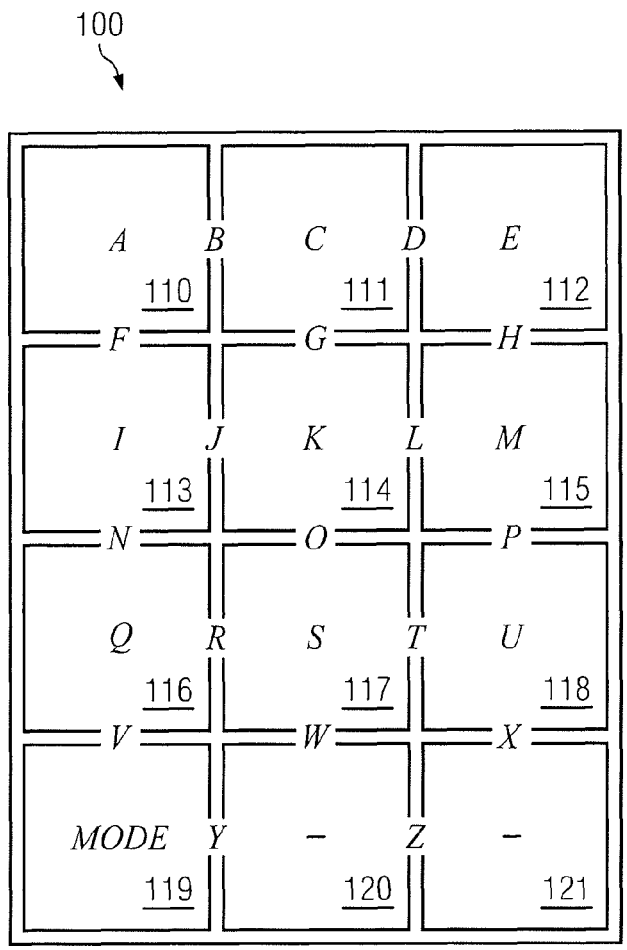
FIG. 1 illustrates an exemplary structure of a keypad having a numeric centric layout according to one advantageous embodiment of the invention.
Figure 3:
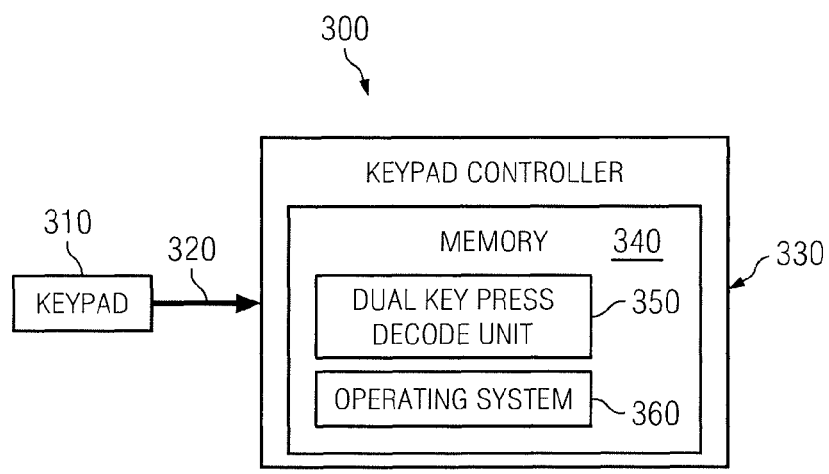
FIG. 3 is schematic diagram of a system of the invention that comprises a keypad controller for controlling a keypad of the invention according to an advantageous embodiment of the invention.

FIGS. 1 through 3, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged computer device.

FIG. 1 illustrates an exemplary structure of a keypad 100 having a numeric centric layout according to some embodiments of the present disclosure. The embodiment of the keypad 100 shown in FIG. 1 is for illustration only and other embodiments could be used without departing from the scope of this disclosure.

As shown in FIG. 1, the keypad 100 includes twelve full size keys arranged in a three by four matrix. The term "full size" means that the size of the key is large enough to easily receive and accommodate a fingertip of a user. It is understood that while some embodiments may operate with full size keys, other embodiments may be used with keys of any size.

The twelve keys are designated with reference numerals 110 through 121. Key 110 represents the letter 'A'. When a user presses key 110, a single key stroke signal is sent to a controller (not shown in FIG. 1) that represents the unique key definition for the letter 'A'. This feature is represented by the letter 'A' placed in the center of key 110.

Key 111 represents the letter 'C'. When the user presses key 111, a single key stroke signal is sent to the controller (not shown in FIG. 1) that represents the unique key definition of the letter 'C'. This feature is represented by the letter 'C' placed in the center of key 111.

Key 110 and key 111 taken together (i.e., pressed at substantially the same time) represent the letter 'B'. When the user presses key 110 and key 111 at essentially the same time, a dual key stroke signal is sent to the controller (not shown in FIG. 1) that represents the unique key definition of the letter B. The dual key stroke signal can be pair of signals including a first signal associated with the first key 110 and a second signal associated with the second key 111; the dual key stroke signal can be a single signal that is a combination of the first signal associated with the first key 110 and the second signal associated with the second key 111, or the dual key stroke signal can be a single signal that represents the first signal associated with the first key 110 and the second signal associated with the second key 111. This feature is represented by the letter 'B' placed between key 110 and key 111.

When the user presses two keys at essentially the same time (i.e., pressed at substantially the same time), a first signal from one of the two keys may be sent from the keypad 100 before a second signal from the other key is sent from the keypad 100. Although the user presses the two keys at essentially the same time, a small interval of time may exist between the two signals from the keypad 100. A keypad controller 330 (shown in FIG. 3) will consider the two signals to be simultaneously sent by the keypad 100 if the keypad controller 330 receives the two signals within a pre-specified period of time.

The arrangement and structure of keypad 100 allows the user to select the letter 'A', the letter 'B', or the letter 'C' using two full size keys (key 110 and key 111). This means that the keyboard 100 can provide full size keys for a full alphabet of letters in a relatively small area.

The keypad 100 also provides adjacent keys in a vertical direction. For example, key 114 represents the letter 'K'. When a user presses key 114, a single key stroke signal is sent to a controller (not shown in FIG. 1) that represents the unique key definition for the letter 'K'. This feature is represented by the letter 'K' placed in the center of key 114.

Key 117 represents the letter 'S'. When the user presses key 117, a single key stroke signal is sent to the controller (not shown in FIG. 1) that represents the unique key definition of the letter 'S'. This feature is represented by the letter 'S' placed in the center of key 117.

Key 114 and key 117 taken together (i.e., pressed at the substantially the same time) represent the letter 'O'. When the user substantially simultaneously presses key 114 and key 117, a dual key stroke signal is sent to the controller (not shown in FIG. 1) that represents the unique key definition of the letter 'O'. The dual key stroke signal can be a pair of single key stroke signals including a first signal associated with the first key 114 and a second signal associated with the second key 117; the dual key stroke signal can be a single signal that is a combination of the first signal associated with the first key 114 and the second signal associated with the second key 117; or the dual key stroke signal can be a single signal that represents the first signal associated with the first key 114 and the second signal associated with the second key 117. This feature is represented by the letter 'O' placed between key 114 and key 117.

The keypad 100 provides the entire alphabet from 'A' to 'Z' using twelve full size keys arranged in a three by four array as shown in FIG. 1. The letter 'V' is selected by substantially simultaneously pressing key 116 for the letter 'Q' and the Mode key 119. The letter 'X' is selected by substantially simultaneously pressing key 118 for the letter 'U' and the blank key 121. The letter 'Y' is selected by substantially simultaneously pressing the Mode key 119 and the blank key 120. The letter 'Z' is selected by substantially simultaneously pressing the blank key 120 and the blank key 121.

Numbers '0' through '9' may be associated with a number of respective keys of the keypad 100. In one embodiment, the number '1' is associated with the 'A' key 110, the number '2' is associated with the 'C' key 111, the number '3' is associated with the 'E' key 112, and so forth. The number '0' is associated with the blank key 120. When the user, at substantially the same time, presses the Mode key 119 and one of the keys associated with a number the keypad 100, the number is selected and an appropriate signal, or signals, is sent to the controller that represents the selected number.

For example, assume that the user substantially simultaneously presses the 'Mode' key 119 and the 'K' key 114. Pressing this combination of keys (119 and 114) selects the number five (5) that is associated with the 'K' key 114. The keypad 100 therefore provides the entire alphabet from 'A' to 'Z' and numbers '0' through '9' using twelve full size keys arranged in a three by four array as shown in FIG. 1.

FIG. 2 illustrates an exemplary structure of a keypad 200 having a QWERTY layout according to some embodiments of the present disclosure. The embodiment of the keypad 200 shown in FIG. 2 is for illustration only and other embodiments could be used without departing from the scope of this disclosure.

The keypad 200 operates in a manner that is similar to the manner that has been previously described for keypad 100. However, as shown in FIG. 2, keypad 200 includes eighteen full size keys arranged in an array of three keys by six keys. The first key is the key 210 for the letter 'Q'. The second key is the key 211 for the letter 'E'. In the manner that has been previously described, pressing the 'Q' key 210 and the 'E' key 211 at substantially the same time selects the letter 'W'. The sequence of letters in keypad 200 is arranged in the QWERTY sequence of a typewriter.

Numbers '0' through '9' may be associated with a number of respective keys of the keypad 200. In one embodiment, the number '1' is associated with the 'Q' key 210, the number '2' is associated with the 'E' key 211, the number '3' is associated with the 'T' key 212, and so forth. When the user presses, at substantially the same time, the 'Mode' key 222 and one of the keys associated with a number the keypad 200, the number is selected and an appropriate signal, or signals, is sent to the controller that represents the selected number.

FIG. 3 is schematic diagram of a system 300 including a controller 330 for controlling the keypad 310 according to some embodiments of the present disclosure. The embodiment of the keypad 300 shown in FIG. 3 is for illustration only and other embodiments could be used without departing from the scope of this disclosure.

The keypad 310 provides key stroke signals 320 to the keypad controller 330. The keypad controller 330 includes a computer memory unit 340. The computer memory unit 340 includes a dual key press decode unit 350 and an operating system 360. The keypad controller 330 includes computer hardware and computer software instructions that cooperate and work together to carry out the operations of the keypad controller 330.

The keypad controller 330 can receive both single key stroke signals and dual key stroke signals from the keypad 310. The keypad controller 330 uses the dual key press decode unit 350 to decode the various key stroke signals. In this manner the keypad controller 330 determines which letter of the alphabet (and which numeral when the Mode key is pressed) is associated to the received key stroke signal.

A mobile computing device may include a system 300 that includes the keypad 310 and the keypad controller 330. The a mobile computing device can be a portable device such as, but not limited to, a cellular telephone, a handheld computer, a personal digital assistant (PDA), a global positioning system (GPS), and any other similar type of device.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A system for entering characters into a computer device, the system comprising:
    a keypad comprising:
        a plurality of keys each associated with at least one character; and
        a "mode" key not associated with any one character, wherein the keypad is configured to send a first signal when a first of the plurality of keys is depressed, a second signal when a second of the plurality of keys is depressed, and a third signal when the "mode" key is depressed, wherein the first and second keys are adjacent to each other; and
    a controller configured to receive signals from the keypad, the controller further configured to identify:
        a first character when the first signal alone is received,
        a second character when the second signal alone is received,
        a third character when both the first and second signals are received at substantially a same time,
        a first number when both the first and third signals are received at substantially a same time, and
        a second number when both the second and third signals are received at substantially a same time.

2. The system as set forth in claim 1, wherein the keypad comprises a numeric centric layout.

3. The system as set forth in claim 1, wherein the keypad comprises a QWERTY layout.

4. The system as set forth in claim 1, wherein the controller is configured to identify the third character when the first signal and the second signal are received within a specified period of time.

5. The system as set forth in claim 1, wherein the controller comprises a dual key press decode unit configured to determine a selected character based on a key stroke signal, and wherein the controller is further configured to identify the third character when a single signal combination of the first and second signals is received, and to identify the third character when a single signal representing the first and second signals is received.

6. The system as set forth in claim 1, wherein the computer device is one of: a cellular telephone; a handheld computer; a personal digital assistant (PDA); and a global positioning system (GPS).

7. The system as set forth in claim 1, wherein the controller is capable of receiving a single key stroke signal and a dual key stroke signal.

8. The system as set forth in claim 1, wherein the controller is further configured to switch between an alphabetic mode and a numerical mode when the third signal is received.

9. A method for entering characters into a computer device, the method comprising:
    receiving at least one key stroke signal from a keypad, the keypad comprising:
        a plurality of keys each associated with at least one character; and
        a "mode" key not associated with any one character, wherein each key is configured to generate a key stroke signal such that a first key stroke signal is generated when a first of the plurality of keys is depressed, a second key stroke signal is generated when a second of the plurality of keys is depressed, and a third key stroke signal is generated when the "mode" key is depressed, and wherein the first and second keys are adjacent to each other; and
    determining a selected character associated with the at least one received key stroke signal;
    wherein a first character is identified when the first key stroke signal alone is received,
    wherein a second character is identified when the second key stroke signal alone is received,
    wherein a third character is identified when both the first key stroke signal associated with the first key and the second key stroke signal associated with a second key are received at substantially a same time,
    wherein a first number is identified when both the first key stroke signal associated with the first key and the third key stroke signal associated with the "mode" key are received at substantially a same time, and
    wherein a second number is identified when both the second key stroke signal associated with the second key and the third key stroke signal associated with the "mode" key are received at substantially a same time.

10. The method as set forth in claim 9, wherein the keypad comprises one of: a numeric centric layout; and a QWERTY layout.

11. The method as set forth in claim 9, wherein the at least one received key stroke signal comprises the first key stroke signal associated with the first key and the second key stroke signal associated with the second key.

12. The method as set forth in claim 11, wherein the third character is identified when the first key stroke signal and the second key stroke signal are both received within a specified time.

13. A portable computer device, the device comprising:
    a keypad comprising:
        a plurality of keys each associated with at least one of a number of characters; and
        a "mode" key not associated with any one character, the keypad configured to send at least one key stroke signal such that a first key stroke signal is sent when a first of the plurality of keys is depressed, a second key stroke signal is sent when a second of the plurality of keys is depressed, and a third key stroke signal is sent when the "mode" key is depressed, and wherein the first and second keys are adjacent to each other and; and
    a controller configured to receive the at least one key stroke signal, the controller further configured to identify:
        a first character when only a first key stroke signal is received in response to depressing only the first key,
        a second character when only a second key stroke signal is received in response to depressing only the second key,
        a third character when a pair of key stroke signals including the first key stroke signal and the second key stroke signal are received in response to the first key and the second key being depressed at substantially a same time, a first number when a pair of key stroke signals including the first key stroke signal and the third key stroke signal are received in response to the first key and the "mode" key being depressed at substantially a same time, and a second number when a pair of key stroke signals including the second key stroke signal and the third key stroke signal are received in response to the second key and the "mode" key being depressed at substantially a same time.

14. The device as set forth in claim 13, wherein the keypad comprises one of: a numeric centric layout; and a QWERTY layout.

15. The device as set forth in claim 13, wherein the controller is capable of receiving a single key stroke signal and a dual key stroke signal.

16. The device as set forth in claim 13, wherein the controller is configured to identify the third character when the first key stroke signal and the second key stroke signal are both received in response to depressing the first key and the second key within a specified period of time.

17. The device as set forth in claim 13, wherein the controller comprises a dual key press decode unit configured to decode the at least one key stroke signal and to identify the selected character based on one or more key stroke signals contained in the at least one key stroke signal.

18. The device as set forth in claim 13, wherein the computer device is one of: a cellular telephone; a handheld computer; a personal digital assistant (PDA); and a global positioning system (GPS).

* * * * *